(12) United States Patent
Murai

(10) Patent No.: US 6,398,349 B1
(45) Date of Patent: Jun. 4, 2002

(54) PIEZOELECTRIC DEVICE, INK-JET PRINTING HEAD, AND METHOD FOR MANUFACTURING SAME, AND PRINTER

(75) Inventor: Masami Murai, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/423,196

(22) PCT Filed: Mar. 4, 1999

(86) PCT No.: PCT/JP99/01058
§ 371 (c)(1),
(2), (4) Date: Feb. 16, 2000

(87) PCT Pub. No.: WO99/45598
PCT Pub. Date: Sep. 10, 1999

(30) Foreign Application Priority Data

| Mar. 4, 1998 | (JP) | ............................................. 10-052196 |
| Mar. 27, 1998 | (JP) | ............................................. 10-081168 |
| Nov. 5, 1998 | (JP) | ............................................. 10-314413 |
| Nov. 6, 1998 | (JP) | ............................................. 10-316605 |

(51) Int. Cl.[7] ................................................. B41J 2/045
(52) U.S. Cl. ............................................. 347/68; 347/71
(58) Field of Search ............................. 347/68, 54, 20, 347/70, 72, 71; 428/641; 361/303; 310/358

(56) References Cited

U.S. PATENT DOCUMENTS

| 5,006,421 A | * 4/1991 | Yang et al. .................. 428/641 |
| 5,122,923 A | 6/1992 | Matsubara et al. ....... 361/321.5 |
| 5,191,510 A | 3/1993 | Huffman ..................... 361/313 |
| 5,825,121 A | * 10/1998 | Shimada ...................... 310/358 |
| 6,052,271 A | * 4/2000 | Nakamura ................... 361/303 |

FOREIGN PATENT DOCUMENTS

| JP | 6-20866 | 1/1994 | ............ H01G/4/10 |
| JP | 7-245236 | 9/1995 | ............ H01G/4/33 |
| JP | 7-245237 | 9/1995 | ............ H01G/4/33 |

OTHER PUBLICATIONS

Y. Kutanda et al., "Evaluation of PZT Thin Film Before and After Hydrogen–anneal Using TEM", 59th Scientific Lecture of Applied Physics Society Draft Collection, Sep., 1998.
H. Kanaya et al., "Degradation Mechanism of Pt/PZT/Pt Capacitors Under Low Pressure Hydrogen Atmosphere", Sep., 1998.
I. Kunishima et al., "Current Leakage Mechanism of PZT Capacitor in Ir Electrode", Sep. 1998.

\* cited by examiner

*Primary Examiner*—Anh T. N. Vo
(74) *Attorney, Agent, or Firm*—Sterne, Kessler, Goldstein & Fox P.L.L.C.

(57) ABSTRACT

A piezoelectric device includes an adhesive layer composed of a material which enhances adhesion between a base plane of a piezoelectric device and a lower electrode, a diffusion preventing layer formed with a material which prevents the phenomenon of diffusion of a component of the adhesive layer into the lower electrode, wherein the lower electrode is formed over the diffusion preventing layer, a piezoelectric film formed over the lower electrode and exhibits an electromechanical transducing action, and an upper electrode formed over the lower electrode. The diffusion preventing layer prevents diffusion of titanium which is a principal component of the adhesive layer.

14 Claims, 14 Drawing Sheets

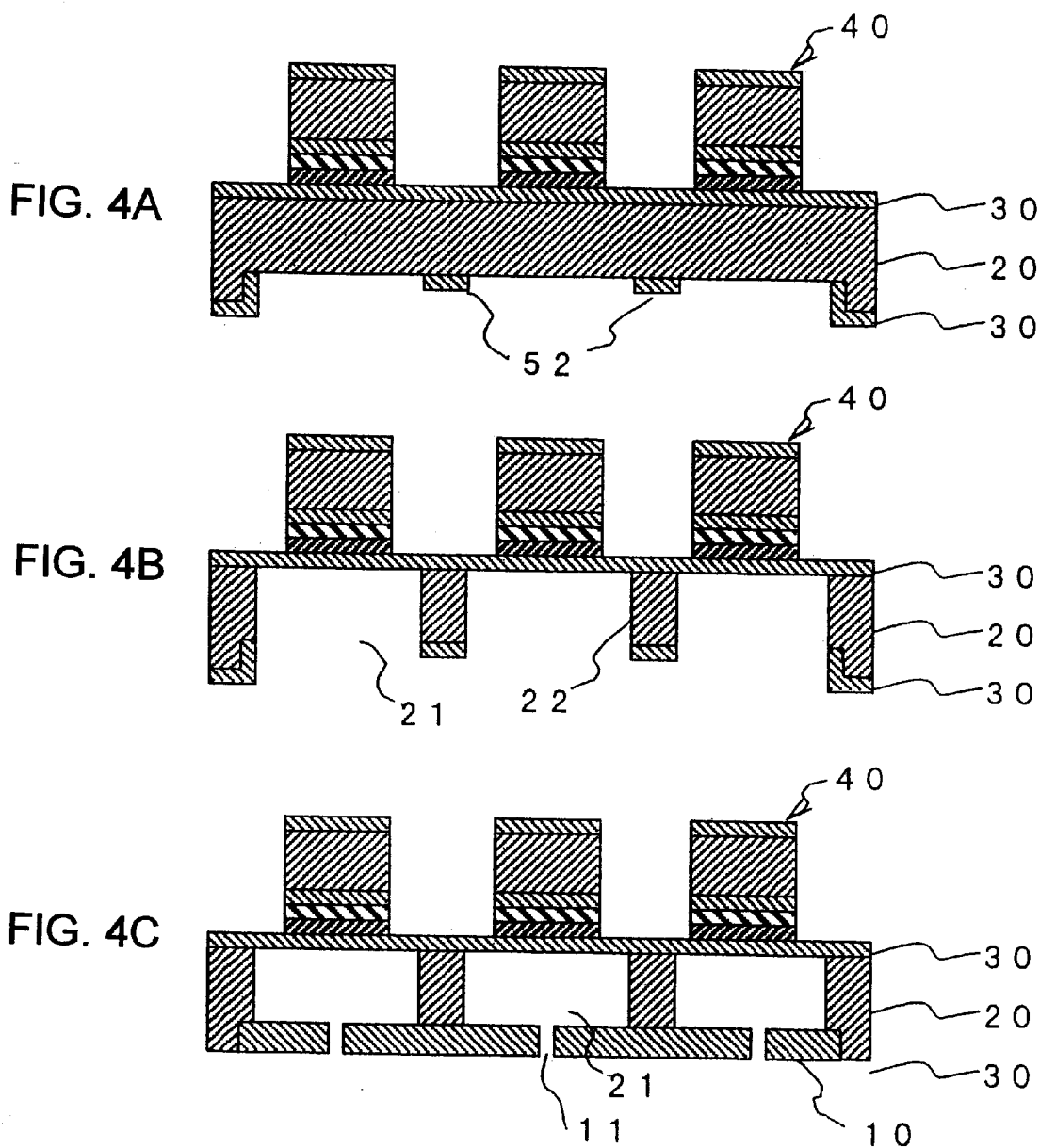

1: ink jet printing head

PIEZOELECTRIC DEVICE, INK-JET PRINTING HEAD, AND METHOD FOR MANUFACTURING SAME, AND PRINTER

TECHNICAL FIELD

The present invention relates to a piezoelectric device used for an ink jet printing head. Particularly, this invention relates to a technique for preventing impurities from diffusing in a lower electrode or a piezoelectric film upon baking the piezoelectric film.

BACKGROUND ART

An ink jet printing head used for an ink jet printer, which obtains letters or desired images by discharging ink drops onto printing paper selectively in accordance with print data to be input, comprises a piezoelectric device which functions as a drive source for discharging ink. The piezoelectric device comprises a piezoelectric film held between an upper electrode and a lower electrode.

A silicon dioxide film which is superior mainly as a diaphragm is used as a base plane for forming the piezoelectric device. Since the silicon dioxide film has bad adhesion with a metal of a lower electrode for the piezoelectric device, an adhesive layer made of titanium is often employed between the diaphragm and the lower electrode.

Platinum is often used for the lower electrode. When the piezoelectric film is formed over a non-oriented film in an amorphous state such as silicon oxide, orientation of the piezoelectric film is disturbed, thereby impairing ferroelectricity. With this regard, it is a characteristic of platinum that it becomes an oriented film even if it is formed over a non-oriented film. Accordingly, the piezoelectric film is made oriented by using platinum for the lower electrode and by composing the piezoelectric film to be formed over the lower electrode.

As metals, other than platinum, used for the lower electrode, for example, U.S. Pat. No. 5,122,923, U.S. Pat. No. 5,191,510, an official gazette of Japanese Laid-Open (Kokai) Publication No. Hei 7-245236, and an official gazette of Japanese Laid-Open (Kokai) Publication No. Hei 7-24523 disclose an alloy of platinum and iridium, iridium, and iridium oxide. These metals are used mainly for the purpose of enhancing the properties of dielectrics and preventing any deterioration with age.

However, methods of using the above-described conventional materials cause various inconveniences.

For example, in the lower electrode, titanium composing the adhesive layer diffuses in, and forms an alloy with, platinum composing the lower electrode upon baking a PZT-type piezoelectric precursor film, thereby lowering the piezoelectric properties.

FIG. 10 shows a diffusion ratio of titanium, which is a principal component of the adhesive layer, in platinum which is a principal component of the lower electrode, upon baking the piezoelectric precursor film. The horizontal axis indicates lengths of the lower electrode and the adhesive layer in a film thickness direction, and the vertical axis indicates respective contents of platinum and titanium in percentage. Measurement was conducted by setting the thickness of the lower electrode as 500 nm and the thickness of the adhesive layer as 20 nm. About 30% titanium is mixed in the lower electrode in the vicinity of an interface between the lower electrode and the adhesive layer. About 5% titanium is mixed at an interface between the lower electrode and the piezoelectric film, which is 500 nm apart from the interface between the lower electrode and the adhesive layer. It can be confirmed that, in the lower electrode, platinum and titanium are alloyed unevenly with respect to the film thickness direction and the orientation of columnar crystals of platinum is disturbed. Such a phenomenon causes disturbance of orientation of the piezoelectric film formed over the lower electrode, thereby giving rise to problems such as lowering of the piezoelectric properties of the piezoelectric device. Moreover, as titanium is mixed unevenly in platinum, physical properties of the lower electrode in the thickness direction change. Such a lower electrode makes designing and processing difficult.

Concerning the piezoelectric film, thermal treatment at the time of baking causes titanium to diffuse in the piezoelectric film through the lower electrode, and the existence of titanium in the piezoelectric film deteriorates the piezoelectric properties of the piezoelectric device. This is because the existence of titanium disturbs a stoichiometric ratio in a composition of the piezoelectric film and a layer of low dielectric constant is generated at an interface between the lower electrode and the piezoelectric film.

On the other hand, it is also indicated that when iridium is used for the lower electrode, a leak current considerably increases (as in "Clarification of Leak Mechanism of PZT Capacitor Accumulated on Ir Electrode" from lecture proceedings for the 59$^{th}$ Applied Physics Society Symposium (published on Sep. 15, 1998), p. 450).

SUMMARY OF THE INVENTION

In consideration of various problems described above, it is a first object of this invention to make it possible to prevent the diffusion of impurities in the piezoelectric film or the lower electrode at the time of manufacture, and to provide a piezoelectric device of high reliability, which will not peel off, and a method for manufacturing such a piezoelectric device.

It is a second object of this invention to provide an ink jet printing head which uses such a piezoelectric device, and to provide a method for manufacturing such an ink jet printing head.

It is a third object of this invention to provide a printer which uses such an ink jet printing head.

The present invention is a piezoelectric device exhibiting an electromechanical transducing action, characterized in that it comprises:

an adhesive layer composed of a material which enhances adhesion between a base plane of the piezoelectric device and a lower electrode of the piezoelectric device;

a diffusion preventing layer composed of a material which prevents a phenomenon of diffusion of a component of the adhesive layer into the electrode;

a lower electrode formed over the diffusion preventing layer;

a piezoelectric film which is formed over the lower electrode and which exhibits the electromechanical transducing action; and an upper electrode formed over the piezoelectric film so as to be paired with the lower electrode.

This invention is a piezoelectric device exhibiting an electromechanical transducing action, characterized in that it comprises:

an adhesive layer composed of a material which enhances adhesion between a base plane of the piezoelectric device and a lower electrode of the piezoelectric device;

a lower electrode formed over the adhesive layer;

a diffusion preventing layer formed over the lower electrode and composed of a material which prevents a phenomenon of diffusion of a component of the adhesive layer into the piezoelectric film and also prevents a phenomenon of diffusion of a component of the piezoelectric film into the lower electrode;

a piezoelectric film which is formed over the diffusion preventing layer and which exhibits the electromechanical transducing action; and an upper electrode formed over the piezoelectric film so as to be paired with the lower electrode.

The diffusion preventing layer is an alloy of titanium and one device selected from a group consisting of iridium, palladium, rhodium, ruthenium, and osmium.

The adhesive layer contains, as its principal component, one device selected from a group consisting of titanium and chromium.

The lower electrode is composed of platinum as its principal component.

This invention is an ink jet printing head comprising the piezoelectric device of this invention, as a piezoelectric actuator, over a diaphragm which serves as the base plane.

The diaphragm has a laminated structure of silicon dioxide and zirconium oxide.

This invention is a printer comprising the ink jet printing head of this invention as printing means.

This invention is a method for manufacturing a piezoelectric device exhibiting an electromechanical transducing action, characterized in that it comprises:

an adhesive layer forming step of forming, over a base plane of the piezoelectric device, an adhesive layer with a material which enhances adhesion between the base plane and a lower electrode of the piezoelectric device;

a diffusion preventing layer forming step of forming, over the adhesive layer, a diffusion preventing layer with a material which prevents a phenomenon of diffusion of a component of the adhesive layer into the electrode;

a lower electrode forming step of forming, over the diffusion preventing layer, a lower electrode by using a conductive material;

a piezoelectric film forming step of forming, over the lower electrode, a piezoelectric film by using a piezoelectric material; and an upper electrode forming step of forming, over the piezoelectric film, an upper electrode by using a conductive material.

This invention is a method for manufacturing a piezoelectric device exhibiting an electromechanical transducing action, characterized in that it comprises:

an adhesive layer forming step of forming, over a base plane of the piezoelectric device, an adhesive layer with a material which enhances adhesion between the base plane and a lower electrode of the piezoelectric device;

a lower electrode forming step of forming, over the adhesive layer, a lower electrode by using a conductive material;

a diffusion preventing layer forming step of forming, over the lower electrode, a diffusion preventing layer with a material which prevents a phenomenon of diffusion of a component of the adhesive layer into the piezoelectric film, and which also prevents a phenomenon of diffusion of a component of the piezoelectric film into the lower electrode;

a piezoelectric film forming step of forming, over the diffusion preventing layer, a piezoelectric film by using a piezoelectric material; and an upper electrode forming step of forming, over the piezoelectric film, an upper electrode by using a conductive material.

The diffusion preventing layer forming step is the step of forming the diffusion preventing layer by using, as its principal component, one device selected from a group consisting of iridium, palladium, rhodium, ruthenium, and osmium as starting materials.

The adhesive layer forming step is the step of forming the adhesive layer by using, as its principal component, one device selected from a group consisting of titanium and chromium.

The lower electrode forming step is the step of forming the lower electrode by using platinum as its material.

The piezoelectric film forming step is the step including a thermal treatment step.

BRIEF DESCRIPTION OF THE DRAWINGS

FIGS. 3A–3F show steps (2) of manufacturing the ink jet printing head of Embodiment 1.

FIGS. 4A–4I show steps (3) of manufacturing the ink jet printing head of Embodiment 1.

FIGS. 14A–14F show steps (2) of manufacturing an ink jet printing head of Embodiment 3.

BEST MODE FOR CARRYING OUT THE INVENTION

Figure 1:
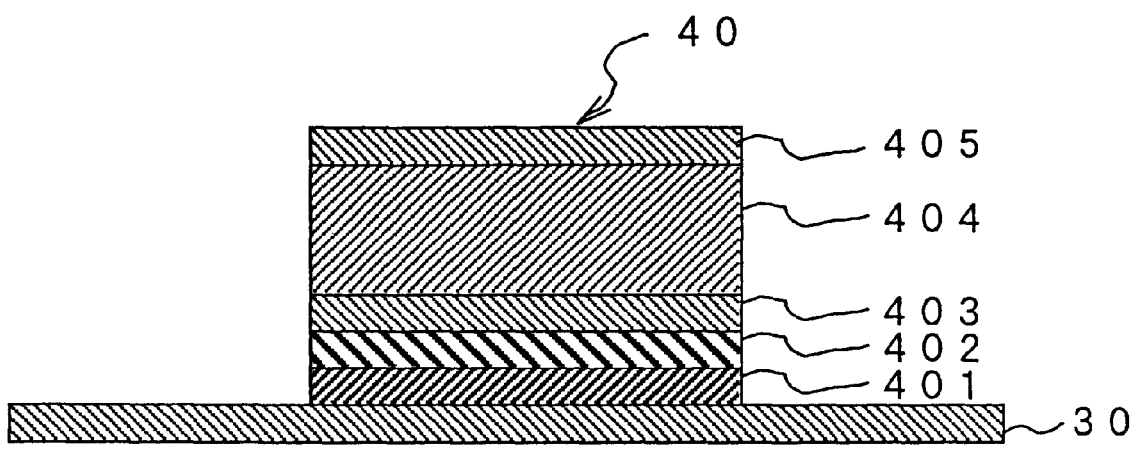
FIG. 1 is a sectional view of a piezoelectric device of Embodiment 1.

The best mode for carrying out this invention is hereinafter explained with reference to the attached drawings. In the following descriptions, the same reference numeral indicates the same composition or the same name.

Embodiment 1

Embodiment 1 of this invention relates to a piezoelectric device, an ink jet printing head, and a printer in which a diffusion preventing layer is newly provided between a lower electrode and an adhesive layer.

FIG. 1 is a sectional view of a piezoelectric device of this embodiment, which describes the structure of the piezoelectric device. A piezoelectric device 40 of Embodiment 1 is composed by laminating, over a diaphragm which forms a base plane, an adhesive layer 401, a diffusion preventing layer 402, a lower electrode 403, a piezoelectric film 404, and an upper electrode 405.

The adhesive layer 401 is composed of a material which enhances adhesion between the base plane of the piezoelectric device and the lower electrode of the piezoelectric device. The adhesive layer 401 contains, as its principal component, one device selected from a group consisting of titanium and chromium. The adhesive layer 401 is formed with a thickness approximately in the range of 10 nm to 50 nm.

The diffusion preventing layer 402 is formed with a material which prevents components of the adhesive layer from diffusing into the electrode. The diffusion preventing layer 402 is an alloy of titanium and one device selected from a group consisting of iridium, palladium, rhodium, ruthenium, and osmium. The diffusion preventing layer prevents titanium, which is a principal component of the adhesive layer 401, from diffusing into the lower electrode 403 upon baking a piezoelectric precursor film by applying thermal treatment such as a sol-gel method. However, it is also possible to apply other devices to the diffusion preventing layer as long as they have physico-chemical properties similar to those of the above-listed devices. The diffusion preventing layer 402 is formed with a thickness approximately in the range of 20 nm to 150 nm.

The lower electrode 403 is formed with a conductive material over the diffusion preventing layer 402 and is opposed to the upper electrode 405. Application of voltage between the two electrodes makes it possible to cause an electromechanical transducing action at the piezoelectric film 404. The lower electrode 403 is composed particularly by containing platinum as its principal component. The lower electrode is formed with a given thickness (approximately from 0.1 $\mu$m to 0.5 $\mu$m).

The piezoelectric film 404 is a crystal film of a perovskite structure, which is formed over the lower electrode 403 and which is made of ferroelectric ceramic materials, such as PZT, that exhibits an electromechanical transducing action. As examples of materials for the piezoelectric film 404, ferroelectric piezoelectric materials such as lead zirconate titanate (PZT), and such other materials obtained by adding metallic oxide such as niobium oxide, nickel oxide or magnesium oxide to the above-mentioned ferroelectric ceramic materials are preferred. Specifically, lead titanate ($PbTiO_3$), lead zirconate titanate ($Pb(Zr,Ti)O_3$), lead zirconate ($PbZrO_3$), lead lanthanum titanate (($Pb,La)TiO_3$), lead lanthanum zirconate titanate (($Pb,La)(Zr,Ti)O_3$), or lead magnesium neobate zirconium titanate ($Pb (Zr,Ti)(Mg,Nb)O_3$) can be used. Concerning the thickness of the piezoelectric film 404, the thickness is limited to a degree whereby cracks will not be generated in the manufacturing steps, and the piezoelectric film is formed with such a thickness as will exhibit sufficient displacement properties. For example, the piezoelectric film 404 is made with a thickness approximately in the range of 1 $\mu$m to 2 $\mu$m.

The upper electrode 405 is a conductive film formed with a given thickness (approximately 0.1 $\mu$m) by using materials such as gold, platinum, or iridium.

Figure 7:
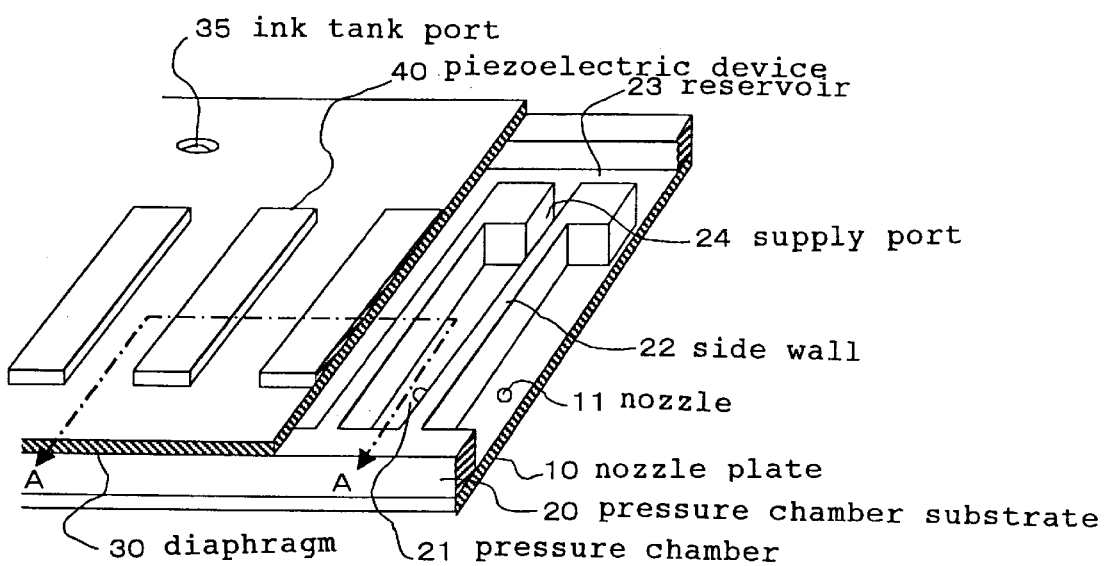
FIG. 7 is an exploded perspective view of the ink jet printing head of this invention.
Figure 8:
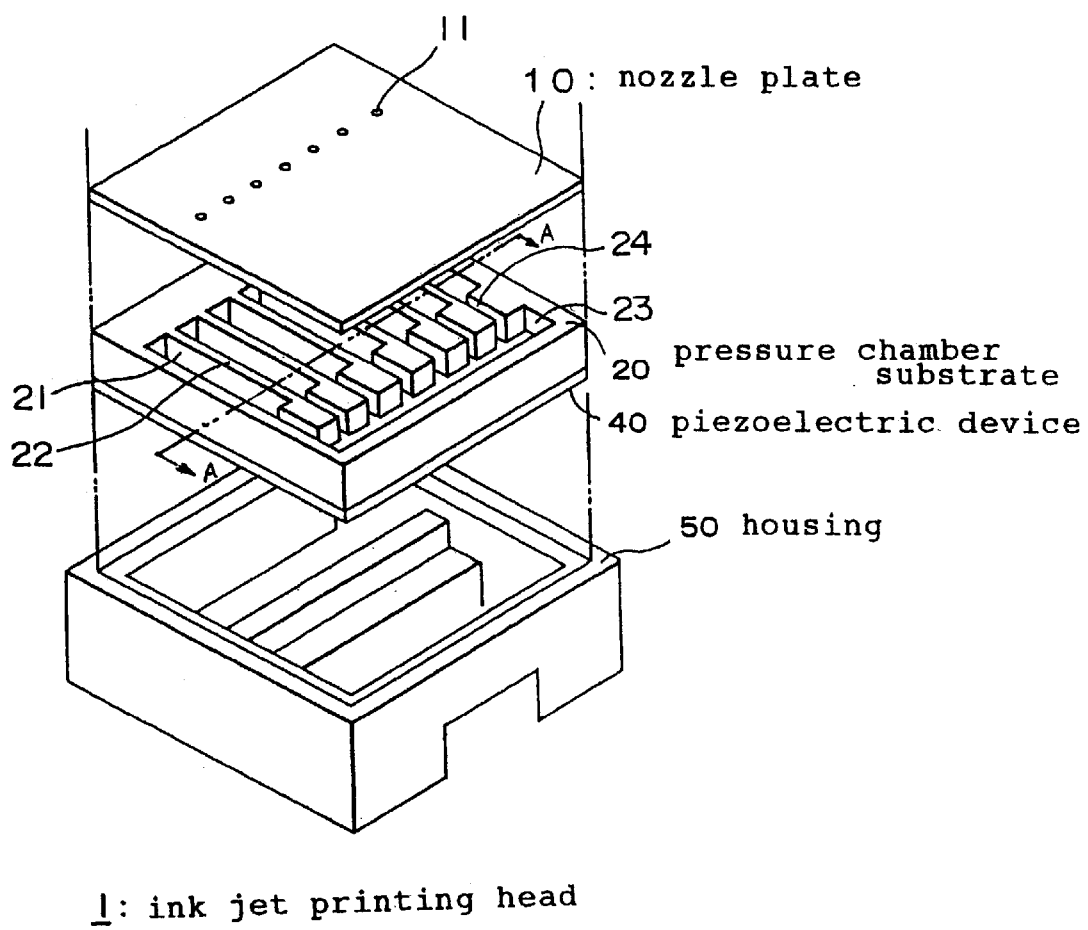
FIG. 8 is a sectional view of a principal part of the ink jet printing head of this invention.

An explanation is hereinafter given about a structure of an ink jet printing head which comprises the piezoelectric device 40 as a piezoelectric actuator. As shown in a partly sectional perspective view of the principal part of FIG. 7 and in an exploded perspective view of FIG. 8, an ink jet printing head 1 is composed by placing a nozzle plate 10, a substrate 30 and the piezoelectric device 40 in a housing 50.

On a pressure chamber substrate 20, pressure chambers (cavities) 21, side walls (partitions) 22, supply ports 24, and a reservoir 23 are formed by etching a silicon substrate. The pressure chambers 21 are spaces for storing ink or the like to be discharged. The side walls 22 are formed to partition the pressure chambers 21. The reservoir 23 forms a common channel to fill the respective pressure chambers 21 with ink. The supply ports 24 are formed so as to be capable of introducing ink from the reservoir 23 to the respective pressure chambers 21.

A diaphragm 30 is formed on one side of the pressure chamber substrate 20, and the piezoelectric devices 40 are provided on the diaphragm 30 at positions corresponding to those of the pressure chambers 21. As the diaphragm 30, an oxide film (silicon dioxide film) is appropriate because it has elasticity, mechanical strength and insulation performance. However, the diaphragm 30 is not limited to an oxide film, and a zirconium oxide film, a tantalum oxide film, a silicon nitride film, or an aluminum oxide film may also be used. An ink tank port 35 is provided at a part of the diaphragm 30 so that it is possible to conduct ink stored in an ink tank (not shown) into the pressure chamber substrate 20. The lower electrode may be made to serve also as the diaphragm by forming the lower electrode 402 and the adhesive layer 401 on the entire surface of the diaphragm 30.

A nozzle plate 10 is mounted on the side of the pressure chamber substrate 20 as opposed to the diaphragm 30. In the nozzle plate 10, nozzles 11 are located at positions corresponding to the respective pressure chambers 21.

The above-described structure of the ink jet printing head is one example, and the piezoelectric device 40 can be applied to any piezo jet heads for which the piezoelectric device can be used as a piezoelectric actuator.

With the structure of the ink jet printing head 1, if voltage is applied between the electrodes and the piezoelectric device 40 is then distorted, the diaphragm 30 deforms in accordance with such distortion. Such deformation gives pressure to ink in the pressure chamber 21, and the ink is thereby discharged from the nozzle 11.

Figure 9:
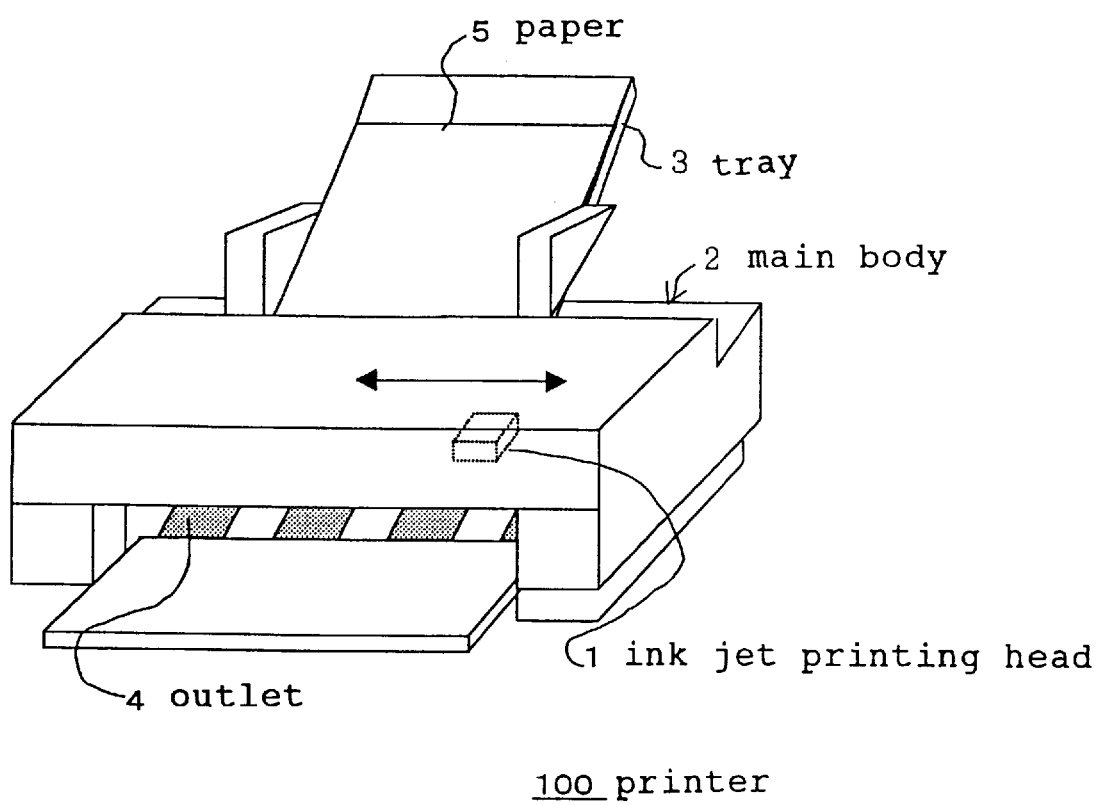
FIG. 9 is a perspective view of a printer of this invention, explains the structure of the printer.
Figure 10:
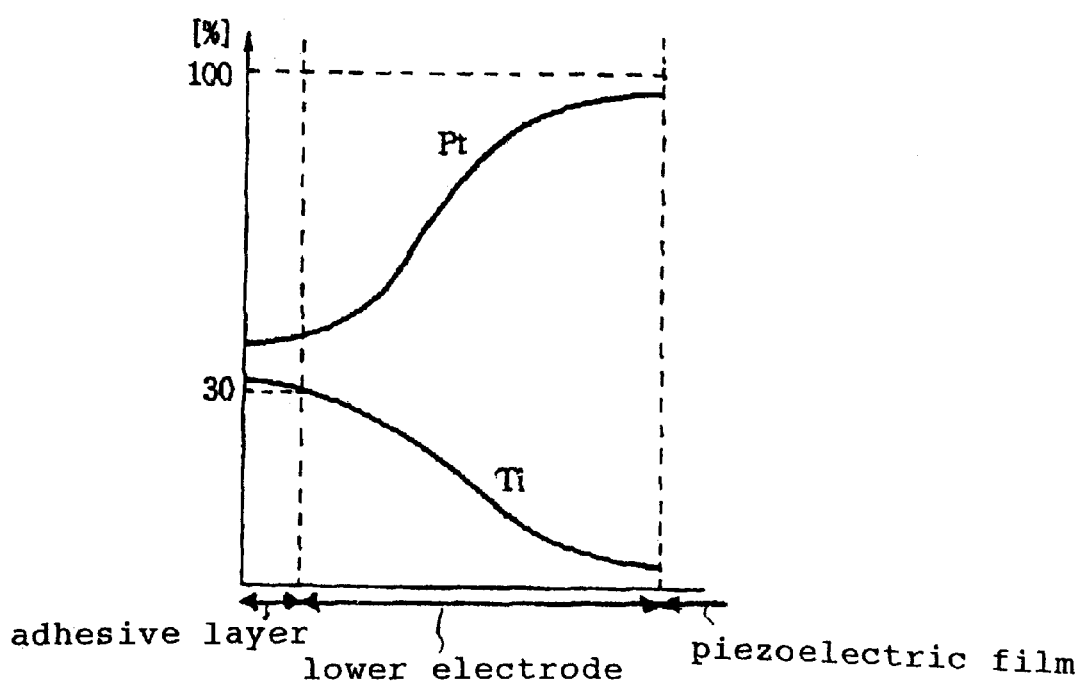
FIG. 10 is a graph indicating a contamination ratio of titanium in a conventional lower electrode.

FIG. 9 is a perspective view of a printer which comprises the ink jet printing head 1 as ink discharging means. As shown in FIG. 9, this printer 100 has a tray 3 and an outlet 4 provided on a printer main body 2. The main body 2 has the ink jet printing head 1 of this invention built therein. In the main body 2, the ink jet printing head 1 is located so as to enable its reciprocating movement over and across paper 5 supplied from the tray 3 by a paper feeding mechanism (not shown). The outlet 4 is an outlet capable of ejecting paper 5 on which printing has been completed.

Manufacturing Method

Figure 2A:
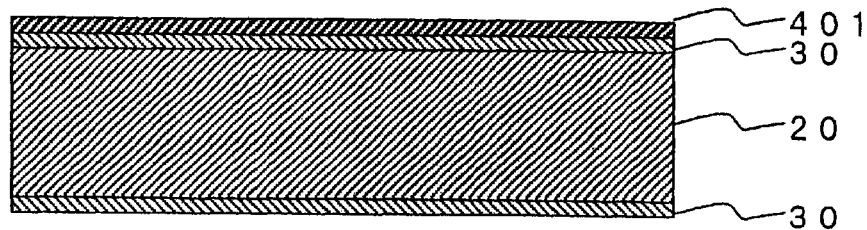
FIGS. 2A–2C show steps (1) of manufacturing an ink jet printing head of Embodiment 1.
Figure 2B:
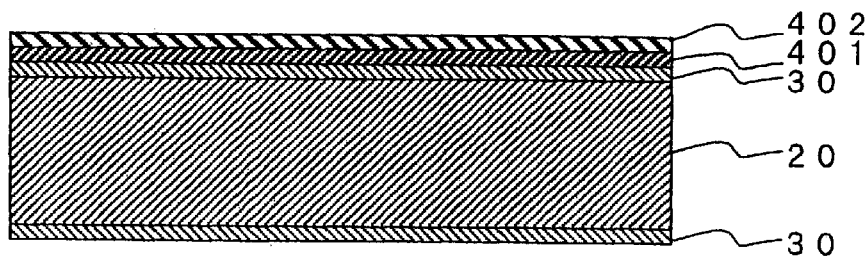
Figure 2C:
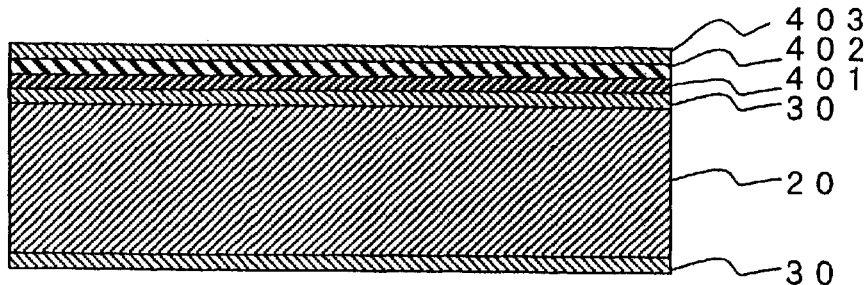
Figure 3A:
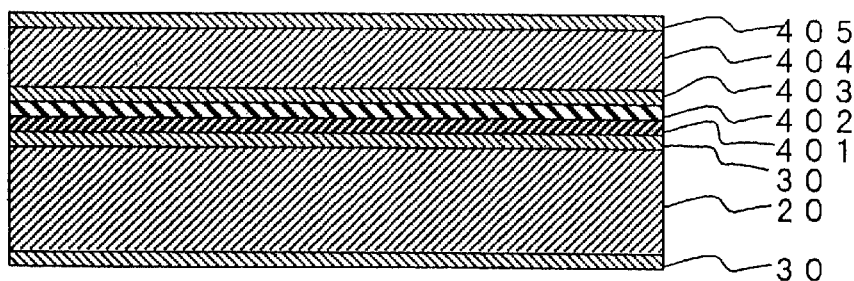
Figure 3B:
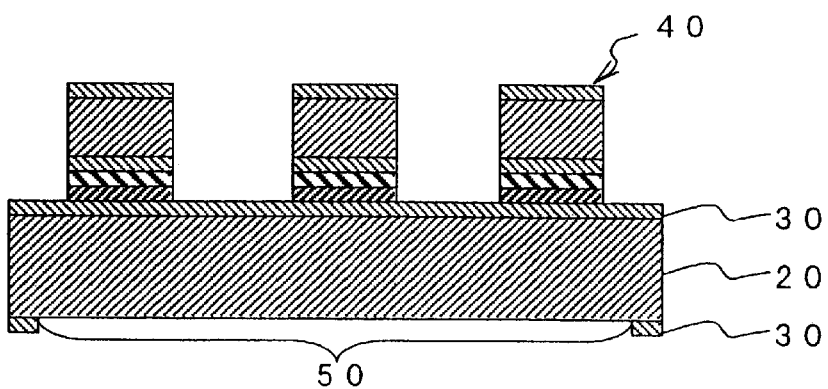
Figure 3C:
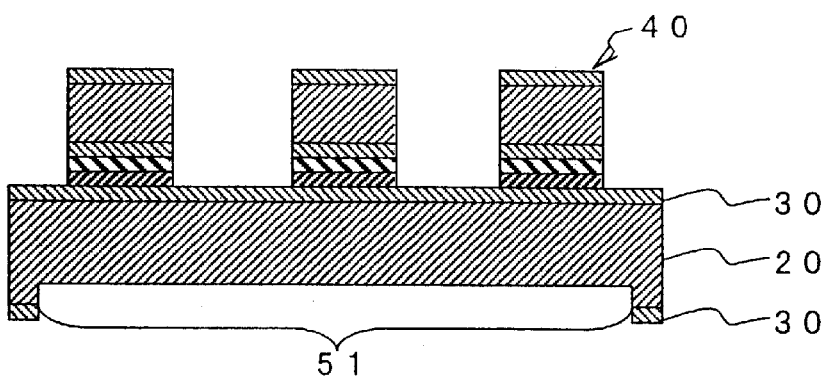

An explanation is hereinafter given about a method for manufacturing a piezoelectric device and an ink jet printing head of this invention. FIGS. 2 through 4 described below are sectional views of the piezoelectric device as taken along lines A—A of FIGS. 7 and 8, which are illustrative of the manufacturing steps.

Adhesive Layer Forming Step (FIG. 2A):

This step is the step of forming, over the base plane of the piezoelectric device 40, the adhesive layer 401 by using a material which will enhance adhesion between the base plane and the lower electrode of the piezoelectric device.

The diaphragm 30 which serves as the base plane is formed by causing oxidation over a silicon single crystal substrate 20 of a given size and thickness (for example, 150 mm in diameter and 600 µm thick) by a thermal oxidation method. The thermal oxidation is to give high-temperature treatment in an oxidizing atmosphere containing oxygen or water vapor. As another method, a CVD method may be employed. As a result of this step, the diaphragm 30 made of silicon dioxide is formed with a thickness of about 1 µm.

As the diaphragm 30, a zirconium oxide film, a tantalum oxide film, a silicon nitride film, an aluminum oxide film or the like may be used instead of the oxide film. Alternatively, a zirconium oxide film, a tantalum oxide film, an aluminum oxide film or the like may be laminated over the oxide film.

Subsequently, a titanium film which becomes the adhesive layer 401 is formed with a thickness of, for example, 10 nm by a sputtering method over the surface of the diaphragm 30 on the side where the piezoelectric device is to be formed. As the adhesive layer 401, chromium can be used instead of titanium.

Diffusion Preventing Layer Forming Step (FIG. 2B):

This step is the step of forming, over the adhesive layer 401, a diffusion preventing layer 402 by using a material which will prevent a phenomenon of diffusion of a component of the adhesive layer into the electrode.

The diffusion preventing layer 402 made of iridium is formed with a thickness of about 100 nm over the surface of the adhesive layer 401 by means of, for example, a sputtering method. As stated above, other than iridium, palladium, rhodium, ruthenium, osmium or the like may be used.

Lower Electrode and Piezoelectric Film Forming Step (FIG. 2C):

This step is the step of forming a lower electrode 403 by using a conductive material over the diffusion preventing layer 402, and of forming a piezoelectric film 404 by using a piezoelectric material over the lower electrode 403.

A platinum film is made with a thickness of, for example, 200 nm by a sputtering film forming method to form the lower electrode 403 over the surface of the diffusion preventing layer 402.

A piezoelectric precursor film is laminated over the surface of the lower electrode 403. For example, if a sol-gel method is employed, a PZT-type piezoelectric film precursor (sol) is used, concerning which a mole mixing ratio of lead titanate to lead zirconate is 44%:56%. The precursor is applied with a uniform thickness. Application of the sol is performed by utilizing conventional techniques such as a spin coating method, a dip coating method, a roll coating method, and a bar coating method. The applied precursor is dried at a given temperature and is then pyrolyzed. The drying step is performed by means of natural drying or by heating at a temperature of 200° C. or lower. The pyrolyzing step is performed by gelling the precursor film and heating it at a temperature sufficient to remove organic substances from the film and for a sufficient period of time. As a result of this step, a porous gel film is obtained, which is made of amorphous metallic oxide which does not substantially contain any residual organic substances. These steps of coating, drying and pyrolyzing are repeated for a certain number of times, for example, ten times until the thickness in the range of 0.8 µm to 2.0 µm is achieved. Concerning the piezoelectric precursor film formed in the above-described manner, if the sol composition is adjusted so that X and Y in a composition formula represented by $Pb_xTi_yZr_zO_3(Y+Z=1)$ become in the range of $1.00 \leq x \leq 1.20$ and $0.4 \leq Y \leq 0.6$, it is possible to provide the piezoelectric film after crystallization with practicable piezoelectric properties. Obviously, other ferroelectric materials mentioned above can also be used.

Subsequently, the entire substrate is heated after the fifth and tenth pyrolysis in order to crystallize the piezoelectric precursor film. For example, an infrared radiation light source (not shown) is used to heat the substrate from its both sides in an oxygen atmosphere by keeping a temperature of 650° C. for five minutes and then heating at a temperature of 900° C. for one minute, and the substrate is then left to cause the temperature to naturally decrease. As a result of this step, the piezoelectric precursor film crystallizes and sinters in the above-described composition, thereby becoming the piezoelectric film 404 having a perovskite crystal structure.

In the thermal treatment of this piezoelectric film 404, titanium of the adhesive layer 401 oxidizes and diffuses. This diffusion causes a change of the diffusion preventing layer 402 into the mixed state of iridium, which has hardly oxidized, and titanium oxide. The layer in such a state is called "alloy" in this specification. The diffusion preventing layer 402 made of this Ir-Ti alloy prevents titanium from diffusing into the piezoelectric film 404 and also prevents oxygen in the piezoelectric film 404 from escaping toward the side of the lower electrode at the time of baking. This action of the diffusion preventing layer 402 can prevent the generation of a low dielectric constant layer due to a change in the stoichiometric ratio of the piezoelectric film 404.

As for the method for manufacturing the piezoelectric film 404, a high frequency sputtering film-forming method, a CVD method, an MOD method, a laser ablation method or the like can be employed other than the sol-gel method.

When the piezoelectric film 404 is formed by the sputtering method, a piezoelectric precursor film in an amorphous state is formed over the lower electrode by means of sputtering by using a PZT sintered body of given components as a target. This piezoelectric precursor film in the amorphous state is heated to cause sintering and crystallization. This sintering treatment is performed by heating the piezoelectric precursor film in an oxygen atmosphere (for example, in oxygen or in a mixed gas of oxygen and inert gas such as argon) at a temperature in the range of 500° C. to 700° C. In this step, the piezoelectric precursor film becomes the piezoelectric film 40 with a crystal particle diameter ranging from 0.005 µm to 0.4 µm.

Moreover, a film of iridium may be formed over the lower electrode 403. This film is formed with a thickness of, for example, 20 nm by the sputtering method. Intervention of the iridium layer between the lower electrode 403 and the piezoelectric film 404 can efficiently prevent oxygen from escaping from the piezoelectric film 404. This makes it possible to prevent aged deterioration of ferroelectricity of the piezoelectric film 404.

Upper Electrode Forming Step (FIG. 3A):

This step is the step of forming, over the piezoelectric film 404, an upper electrode 405 by using a conductive material. For example, iridium is used as the conductive material to form, by the sputtering method, the upper electrode 405 with a thickness of about 100 nm.

The layer structure of the piezoelectric device 40 is completed through the above-described steps. Molding is performed by etching this layer structure in an appropriate shape in order to use it as the piezoelectric device. In the following steps, this layer structure is molded into a shape as a piezoelectric actuator and, at the same time, a structure necessary for an ink jet printing head is formed.

Dry Etching Step (FIG. 3B):

A resist with a uniform film thickness is applied over the upper electrode 405 at corresponding positions where pressure chambers of the substrate 20 are to be formed. As an applying method, any appropriate method such as a spinner method or a spray method is utilized. After the application of the resist, exposure and development are conducted to leave the resist in a shape corresponding to the shape of the piezoelectric actuators. The resist is used as a mask to perform drying etching on the upper electrode 405, the piezoelectric film 404, the lower electrode 403, the diffusion preventing layer 402, and the adhesive layer 401, thereby forming the piezoelectric devices 20 corresponding to the representative pressure chambers. Dry etching is performed by selecting, as appropriate, a gas which exhibits selectivity regarding the respective layer materials.

Figure 5:
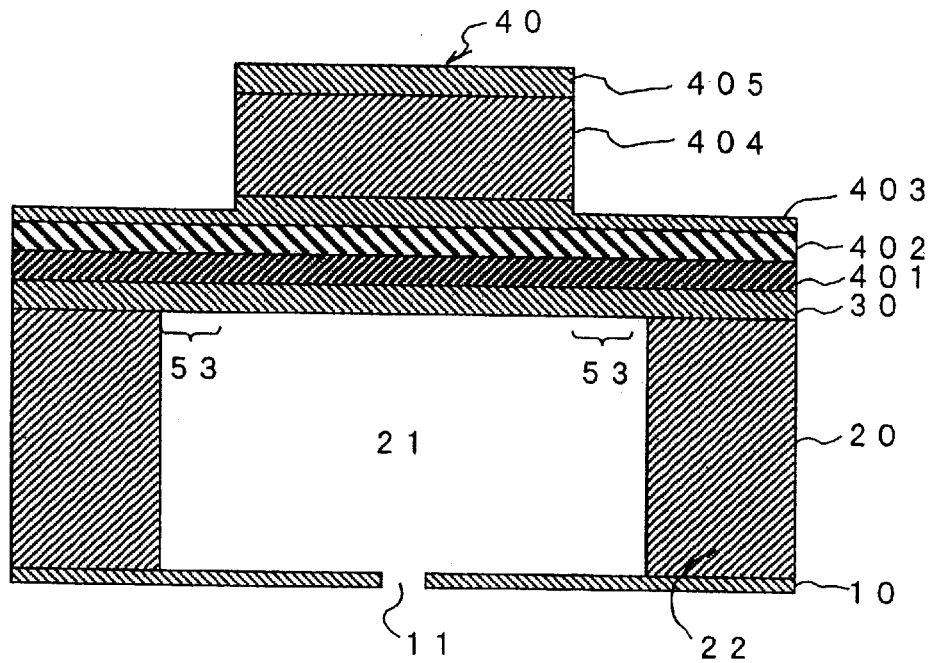
FIG. 5 is a variation example of the ink jet printing head of Embodiment 1.

If the lower electrode 403 is made to function also as a part of the diaphragm, as shown in FIG. 5, it is possible to adjust its diaphragmatic strength by adjusting the film thickness of an area 50, which is a bridge between the piezoelectric device 40 and side walls 22, by changing the depth of etching.

Together with the above step, a protective film made of silicon dioxide is formed by employing a CVD method or the like on the side of the substrate 20 where the piezoelectric devices 20 are formed. Since the piezoelectric devices are already formed, it is necessary to form the film at such a temperature that will not influence the piezoelectric devices. After the formation of the protective film, an oxide film 30 on the pressure chamber side of the substrate 20 is etched with hydrogen fluoride or the like in areas including at least pressure chambers 21 or side walls 22, thereby forming an opening 50.

Wet Etching Step (FIG. 3C):

A wet anisotropy etchant, for example, an aqueous potassium hydroxide solution (concentration: 10%) with its temperature retained at 80° C. is used to etch the area of the opening 50 until a given depth is obtained. Instead of wet etching, anisotropy etching using active gas, such as parallel plane plate reactive ion etching, may be employed. As a result of this step, a concave 51 is formed in the substrate 20.

Oxide Film Forming Step (FIG. 4A):

A chemical vapor phase epitaxy method such as a CVD method is employed on the concave 51 to form an oxide film 302 as an etching protective layer in accordance with the shapes of the pressure chambers 21.

Pressure Chamber Forming Step (FIG. 4B):

An anisotropy etchant, for example, an aqueous potassium hydroxide solution (concentration: 10%) with its temperature retained at 80° C. is used to perform anisotropy etching of the substrate 20 from the pressure chamber side toward the piezoelectric device side. As a result of this step, the pressure chamber 21 portions are etched, thereby forming the side walls 22.

Nozzle Plate Adhering Step (FIG. 4C):

A nozzle plate 10 is adhered to cover the pressure chambers 21 of the pressure substrate 20 formed in the above-described steps. As an adhesive used therefor, any adhesive of epoxy type, urethane type, silicon type or the like can be used.

As for the shape formed by the pressure chamber substrate 20 and the nozzle plate 10, they may be formed integrally by etching a silicon single crystal substrate.

EXAMPLE 1

Figure 6:
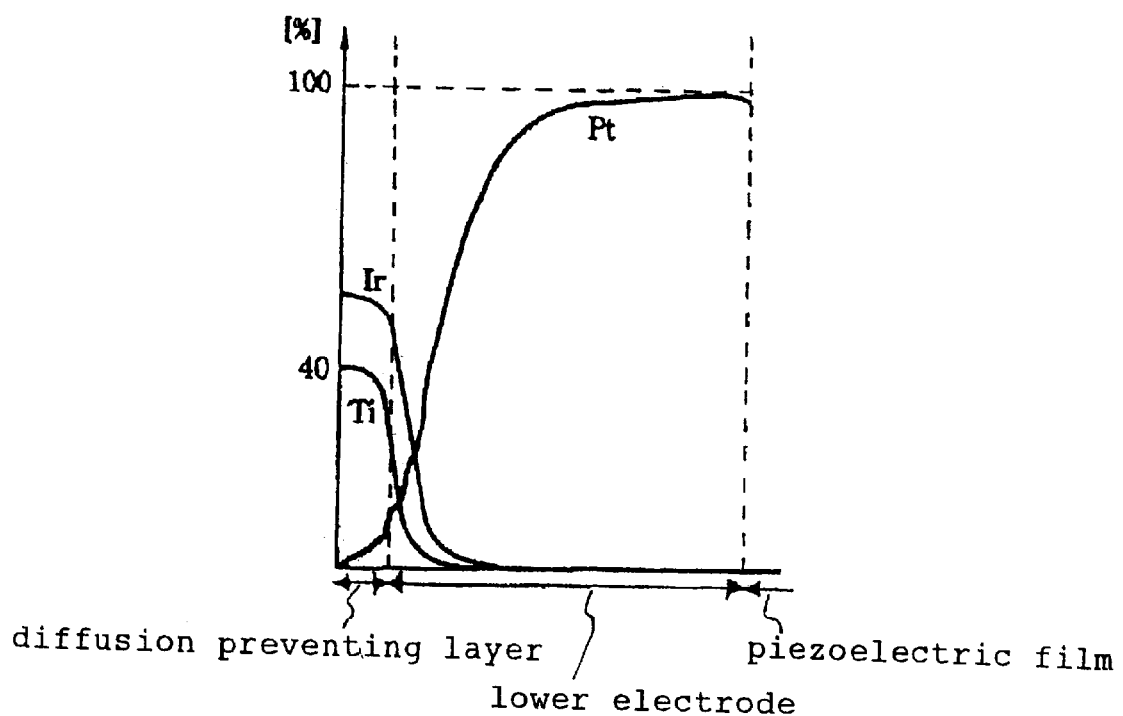
FIG. 6 is a graph indicating a contamination ratio of titanium in a lower electrode in the case of Embodiment 1.

As an example of the piezoelectric device manufactured through the above-described manufacturing steps, FIG. 6 shows the results of an examination of titanium content in the lower electrode. In FIG. 6, the horizontal axis indicates a thickness direction of the lower electrode. The origin is set at an interface between the adhesive layer and the diffusion preventing layer. The vertical axis indicates respective contents of titanium, iridium and platinum in percentage. It is apparent from FIG. 6 that about 40% titanium is contained at the interface between the adhesive layer and the diffusion preventing layer, iridium and titanium are alloyed, and there is little diffusion of titanium into the lower electrode.

According to Embodiment 1, it is possible to prevent the phenomenon of diffusion of titanium, which is the principal component of the adhesive layer, into the lower electrode at the time of baking of the piezoelectric precursor film. Thus, it is possible to maintain the orientation of the lower electrode in a good state. If a ferroelectric ceramic material such as lead zirconate titanate is used as the ferroelectric material (piezoelectric film), the molecular structure in the amorphous state at the time of baking of the piezoelectric film develops to a compact perovskite crystal structure. The orientation at the time of crystallization of the piezoelectric film depends upon the orientation of the lower electrode. Since the lower electrode is oriented well in this embodiment, it is possible to crystallize the piezoelectric film with good orientation. Since the crystal structure which is oriented anisotropically plays a key role in the transduction of electric energy and mechanical energy, this results in the enhancement of the piezoelectric properties of the piezoelectric device.

EXAMPLE 2

The piezoelectric device was manufactured by the manufacturing method of this embodiment by changing the thickness of the lower electrode, the thickness of the piezoelectric film, the number of times of baking and so on. Table 1 shows the results of measurement of adhesive strength between the lower electrode and the substrate in the piezoelectric device. However, a lamination structure of the manufactured piezoelectric device is a layer structure composed of the upper electrode (Pt), the piezoelectric film (PZT), the lower electrode (Pt), the diffusion preventing layer (Ir-Ti), and the substrate. As a comparison, a piezoelectric device having a layer structure without the diffusion preventing layer (the structure composed of the upper electrode (Pt), the piezoelectric film (PZT), the lower electrode (Pt), the adhesive layer (Ti), and the substrate) was used.

TABLE 1

|  | Film Thickness of Lower Electrode | Thickness of Piezoelectric Film | Number of Times of Baking | Adhesive strength |
| --- | --- | --- | --- | --- |
| Example | 500 nm | 0.8 µm | 2 | 19.6 mN |
| Comparison | 500 nm | 0.8 µm | 2 | 17.8 mN |
| Example | 500 nm | 1.2 µm | 4 | 19.0 mN |
| Comparison | 500 nm | 1.2 µm | 4 | 14.2 mN |
| Example | 500 nm | 1.2 µm | 4 | 19.1 mN |
| Comparison | 500 nm | 1.2 µm | 4. | 9.8 mN |

Table 2 shows the results of measurement of a breakdown voltage and a piezoelectric constant $d_{31}$ when the thickness of the piezoelectric film of this example was changed.

TABLE 2

| | Thickness of Piezoelectric Film | Breakdown Voltage | $d_{31}$ at 15V | $d_{31}$ at 25V |
|---|---|---|---|---|
| Example | 0.8 μm | 54V | 201 pC/N | 179 pC/N |
| Comparison | 0.8 μm | 41V | 178 pC/N | 161 pC/N |
| Example | 1.2 μm | 89V | 244 pC/N | 199 pC/N |
| Comparison | 1.2 μm | 62V | 191 pC/N | 170 pC/N |

As can be seen from Table 2, the breakdown voltage and the piezoelectric constant $d_{31}$ of this example are larger than those of the comparison. This is because a low dielectric constant layer does not exist at the interface between the lower electrode and the piezoelectric film in the piezoelectric device of this example.

The value of the piezoelectric constant $d_{31}$ varies depending on the measured voltage because there is a tendency of the piezoelectric constant $d_{31}$ to decrease as the electric field becomes higher. It is effective to increase the thickness of the piezoelectric film in order to enhance the properties of the piezoelectric device. However, it is not desirable to make the thickness of the piezoelectric film too large, because the displacement efficiency lowers. A desirable thickness of the piezoelectric film for an ink jet printing head of high resolution is in the range of approximately 1 μm to 2 μm.

Embodiment 2

Embodiment 2 of this invention relates to a variation of the diaphragm structure of the ink jet printing head.

Figure 11:
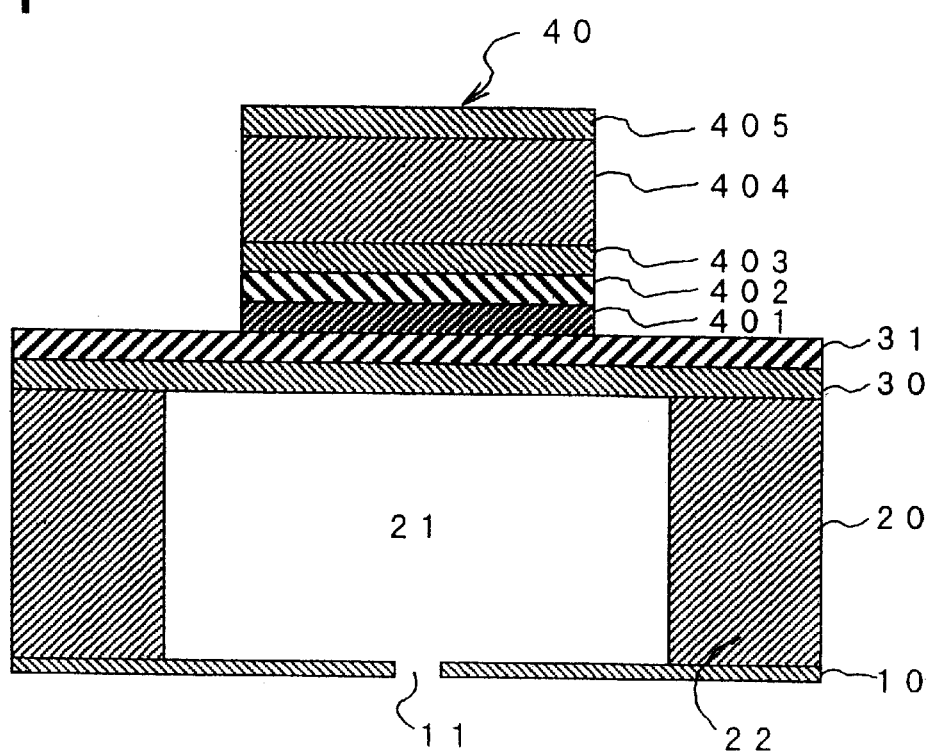
FIG. 11 is a sectional view of a piezoelectric device of Embodiment 2.

FIG. 11 is a sectional view of a principal part of an ink jet printing head of Embodiment 2. The ink jet printing head of Embodiment 2 is different from Embodiment 1 in that the diaphragm of Embodiment 2 has a lamination structure of a silicon dioxide film and a zirconium oxide film. As shown in FIG. 11, the diaphragm of this embodiment comprises an oxide film 30 and a zirconium oxide ($ZrO_2$) film 31.

A method for manufacturing this diaphragm is hereinafter explained. A film forming method such as a thermal oxidation method or a CVD method is employed to form a silicon dioxide film (oxide film 30), which is 1 μm, over a silicon single crystal substrate. Over this silicon dioxide film, a zirconium Zr film is formed with an appropriate thickness (for example, about 400 nm) by a film forming method such as a sputtering method or a vacuum deposition method. High-temperature treatment is given to this film in an oxygen atmosphere. When zirconium is oxidized, it becomes a zirconium oxide film 31.

In the above-described structure, the zirconium film is formed as a crystalline layer. It is known that a crystalline layer exhibits better adhesion than an amorphous layer. Concerning the zirconium oxide film 31, its adhesion with the electric device 40 is enhanced.

It has been experimentally confirmed in experiments that if the zirconium film 31 is used as the diaphragm, vibrating properties of the piezoelectric device are enhanced as compared to the piezoelectric device which does not use zirconium for the diaphragm.

According to Embodiment 2, because zirconium is used as a part of the diaphragm, it is possible to enhance the adhesion between the piezoelectric device and the substrate. Since zirconium is used, it is possible to enhance the piezoelectric properties of the piezoelectric device.

Embodiment 3

Embodiment 3 of this invention relates to a piezoelectric device with a diffusion preventing layer newly provided between a lower electrode and a piezoelectric film.

Figure 12:
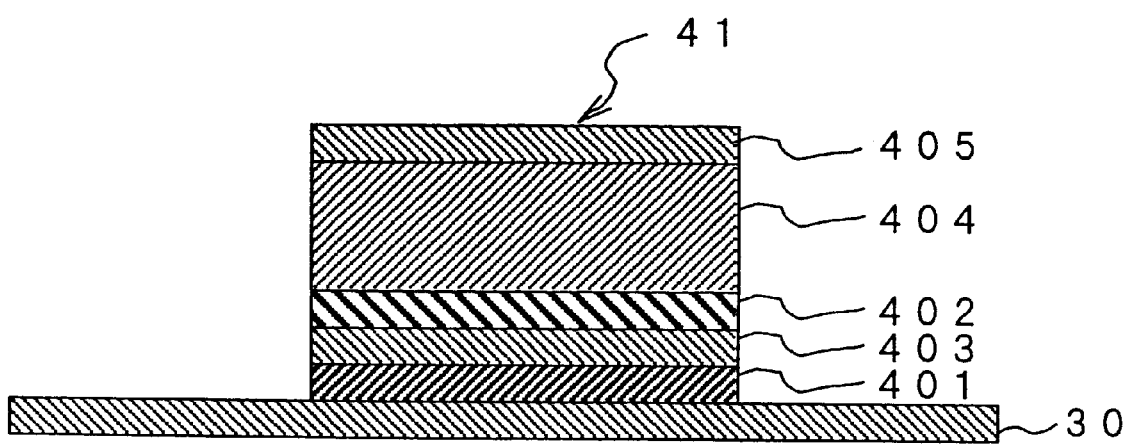
FIG. 12 is a sectional view of a piezoelectric device of Embodiment 3.

FIG. 12 is a sectional view illustrative of a structure of a piezoelectric device of this embodiment. A piezoelectric device 41 of Embodiment 3 is composed by laminating, over a diaphragm 30 which forms a base plane, an adhesive layer 401, a lower electrode 403, a diffusion preventing layer 402, a piezoelectric film 404, and an upper electrode 405. Embodiment 3 is different from Embodiment 1 in that the diffusion preventing layer 402 is located between the lower electrode 403 and the piezoelectric film 404. However, the diffusion preventing layer 402 may be provided between the adhesive layer 401 and the lower electrode 403. In this case, the piezoelectric device will also exhibit the working-effect of Embodiment 1.

Compositions and thicknesses of the respective layers are similar to those of Embodiment 1 and, therefore, descriptions thereof are omitted.

A structure of an ink jet printing head, which comprises this piezoelectric device 41 as a piezoelectric actuator, a method for manufacturing such an ink jet printing head, a structure of a printer, which comprises this ink jet printing head as printing means, and a method for manufacturing such a printer are similar to those of Embodiment 1 and, therefor, descriptions thereof are omitted.

Figure 13A:
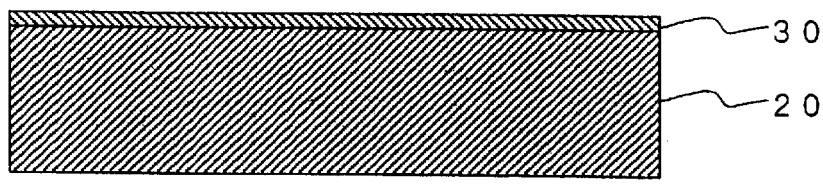
FIGS. 13A–13C show steps (1) of manufacturing an ink jet printing head of Embodiment 3.
Figure 13B:
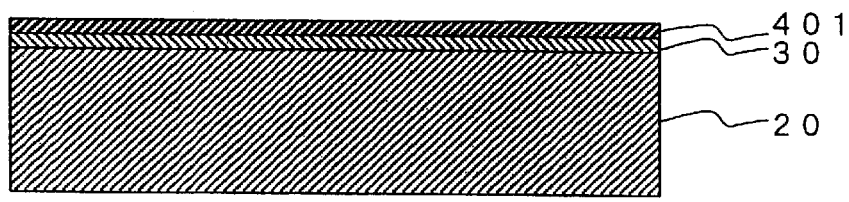
Figure 13C:
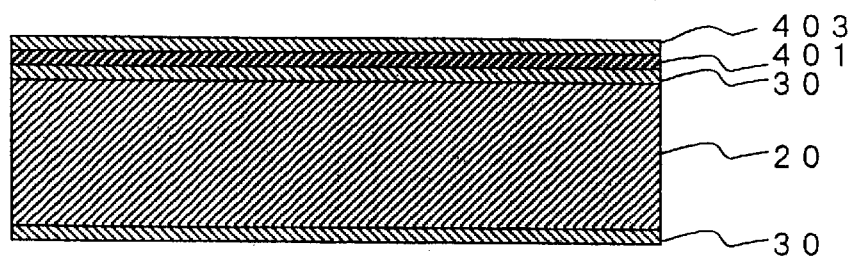
Figure 14A:
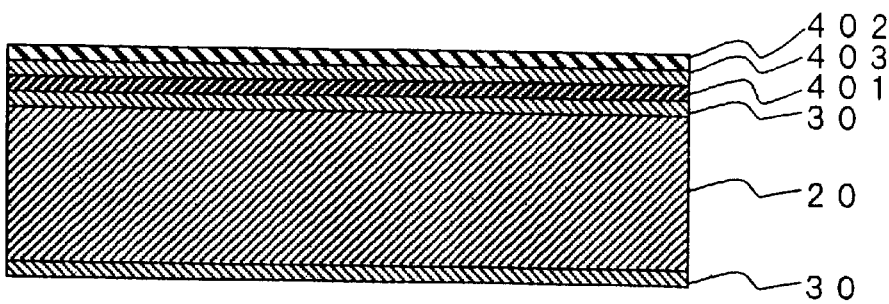
Figure 14B:
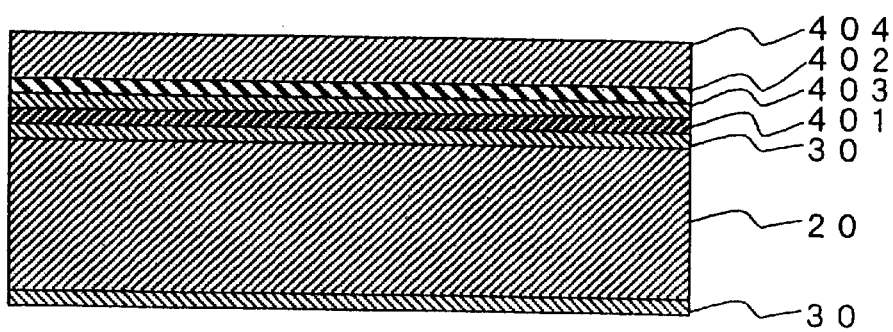
Figure 14C:
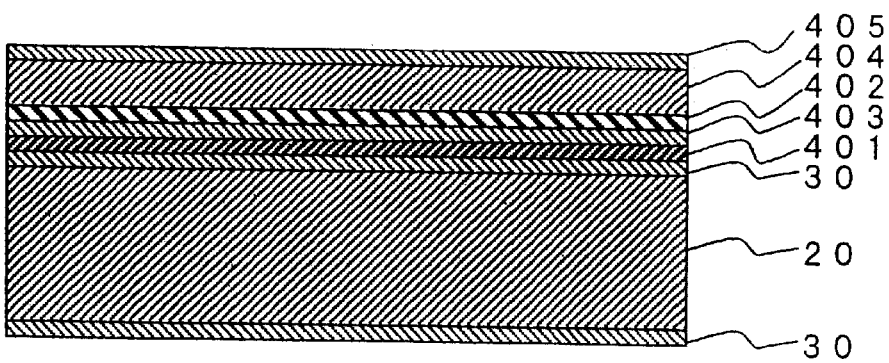

A method for manufacturing the piezoelectric device of this invention is hereinafter explained. FIGS. 13 and 14 explained below are sectional views of the piezoelectric device as taken along lines A—A of FIGS. 7 and 8, which are illustrative of the manufacturing steps.

Diaphragm Forming Step and Adhesive Layer Forming Step (FIGS. 13A and 13B):

These steps are the steps of forming, over a substrate 20, a diaphragm 30 which serves as a base plane, and of forming, over the diaphragm 30, an adhesive layer 401 with a material which will enhance adhesion between the diaphragm 30 and the lower electrode 403. Specific details are similar to the adhesive layer forming step (FIG. 2A) of Embodiment 1.

This diaphragm may have a two-layer structure of silicon dioxide and zirconium oxide as shown in Embodiment 2. The manufacturing method and the working-effect thereof are as stated in Embodiment 2.

Lower Electrode Forming Step (FIG. 13C):

This step is the step of forming, over the adhesive layer 401, a lower electrode 403 by using a conductive material.

A platinum film is formed with a thickness of, for example, 500 nm by a sputtering film forming method over the surface of the adhesive layer 401, thereby forming the lower electrode 403.

Diffusion Preventing Layer Forming Step (FIG. 14A):

This step is the step of forming, over the lower electrode 403, a diffusion preventing layer 402 by using a material which will prevent a phenomenon of diffusion of a component of the adhesive layer 401 into a piezoelectric film 404 and which will also prevent a phenomenon of diffusion of a component of the piezoelectric film 404 into the lower electrode 403.

An iridium film 402 is formed with a thickness of about 20 nm over the surface of the lower electrode 403 by means of, for example, a sputtering method. Other than iridium, palladium, rhodium, ruthenium, osmium or the like may be used. To be accurate, this iridium layer and titanium which has diffused from the adhesive layer due to the thermal treatment at the time of baking of the piezoelectric film are alloyed, thereby forming the diffusion preventing layer 402 of the final composition.

Piezoelectric Film Forming Step (FIG. 14B):

This step is the step of forming, over the diffusion preventing layer 402, a piezoelectric film 404 by using a piezoelectric material.

The piezoelectric film 404 can be formed by a sol-gel method, a sputtering method, a laser ablation method, a CVD method, an MOD method or the like. Specific steps are similar to those of Embodiment 1.

Upon baking a piezoelectric precursor film, titanium which is the principal component of the adhesive layer 401 diffuses through the lower electrode 403 into the iridium layer 402. The diffused titanium deposits as titanium oxide at a grain boundary of iridium in the diffusion preventing layer to form an alloy of iridium and titanium (Ir-Ti layer), thereby forming the diffusion preventing layer 402.

The diffusion preventing layer 402 where iridium and titanium are alloyed prevents titanium of the adhesive layer 401 from diffusing into the piezoelectric film 404 and also prevents lead and oxygen in the piezoelectric film 404 from diffusing into the lower electrode 403. The interface between the diffusion preventing layer 402 and the piezoelectric film 404 has lattice matching at an atomic level, thereby preventing the generation of a low dielectric constant layer. Accordingly, it is possible to obviate the separation between the piezoelectric film and the lower electrode, which may occur as a low dielectric constant layer breaks upon the activation of the piezoelectric device.

Upper Electrode Forming Step (FIG. 14C):

This step is the step of forming, over the piezoelectric film 404, an upper electrode 405 by using a conductive material. For example, iridium is used as the conductive material to form, by the sputtering method, the upper electrode 405 with a thickness of about 100 nm.

The layer structure of the piezoelectric device 41 is completed through the above-described steps. In order to use it as the piezoelectric device, molding is performed by etching this layer structure in an appropriate shape. In order to manufacture an ink jet printing head, this layer structure of the piezoelectric device is molded into a shape as a piezoelectric actuator and, at the same time, a structure necessary for the ink jet printing head is formed. Specific steps are similar to those of Embodiment 1 and, therefore, descriptions thereof are omitted.

EXAMPLE 1

Figure 15:
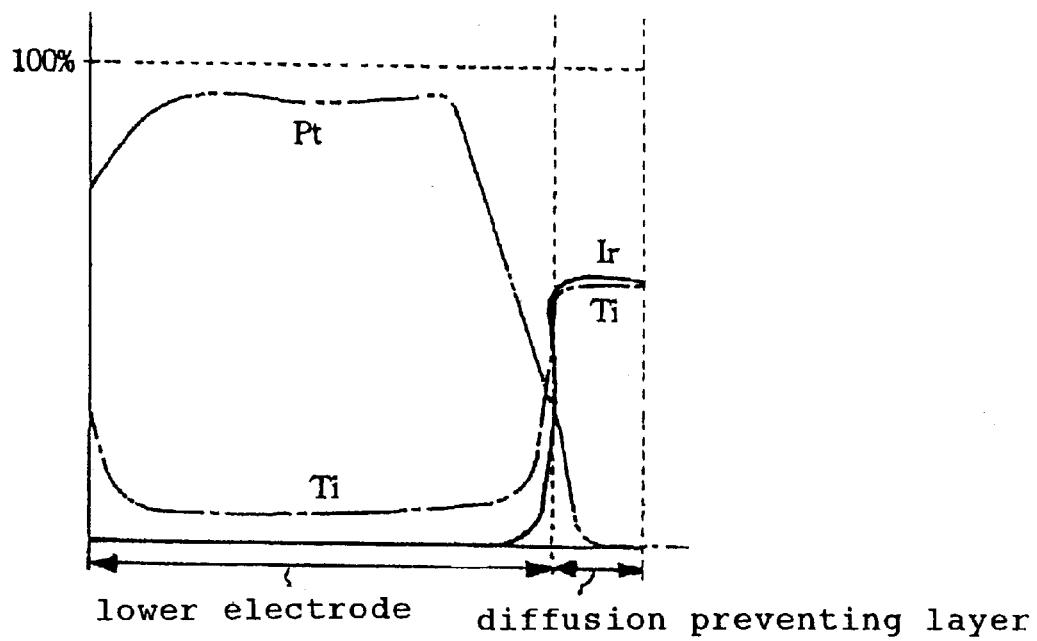
FIG. 15 is a graph indicating a contamination ratio of titanium in the lower electrode in the case of Embodiment 3.

The piezoelectric device was formed by the manufacturing method of this embodiment. FIG. 15 shows the results of measurement to see to what degree the diffusion preventing layer can prevent the diffusion of titanium into the piezoelectric film at the time of baking of the piezoelectric film. As shown in FIG. 15, the titanium content in the diffusion preventing layer was almost constantly about 50% with respect to the film thickness direction. The lower electrode contained almost constantly about 5% titanium. It is apparent that titanium in the adhesive layer partly diffused through the lower electrode and the diffused titanium only partly remained in the lower electrode, and the rest of the titanium and iridium were alloyed and remained in the diffusion preventing layer. Most of the titanium remained in the adhesive layer. It is confirmed that the diffusion preventing layer can effectively prevent the diffusion of titanium into the piezoelectric film at the time of baking of the piezoelectric film.

An analysis was carried out on a composition ratio of Zr to Ti in the piezoelectric film in this example. As a result, it was found that the composition ratio was the same as a synthesis ratio of the sol. It was confirmed that the diffusion preventing layer prevented the components such as oxygen of the piezoelectric film from escaping.

Figure 16:
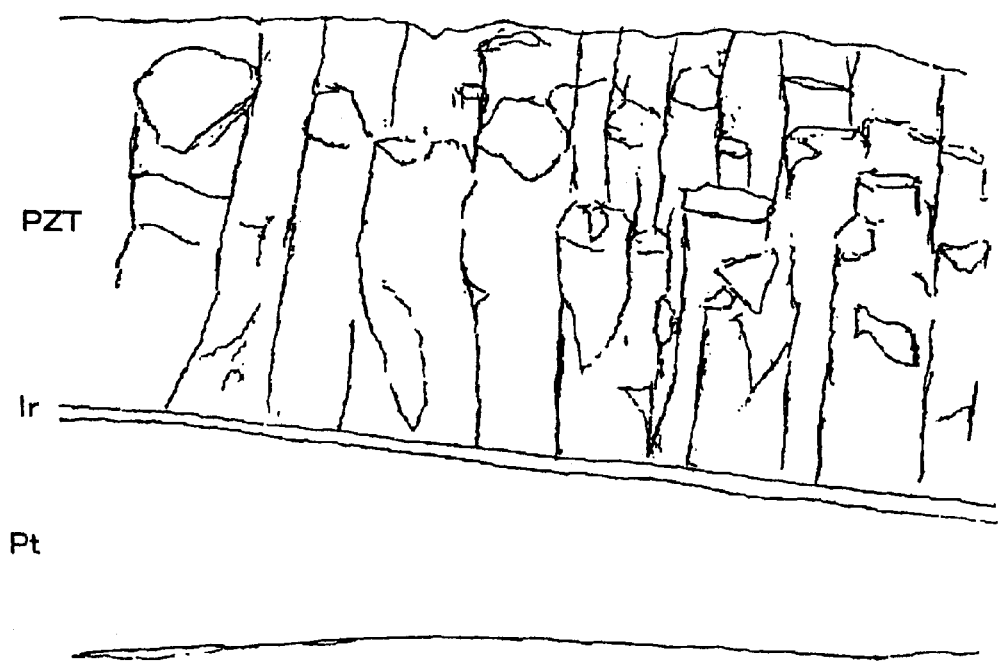
FIG. 16 is a typical diagram of a TEM photograph of an interface between a diffusion preventing layer and a piezoelectric film of the examples.

FIG. 16 is a TEM photograph of the interface between the diffusion preventing layer and the piezoelectric film of this example, which is magnified 100,000 times. As can be seen from FIG. 16, titanium diffused from the adhesive layer remained in the diffusion preventing layer and did not diffuse into the piezoelectric film. It can be confirmed that the lattice arrangement at the interface between the piezoelectric film and the diffusion preventing layer is matching and the piezoelectric film is oriented. It was confirmed that the method for manufacturing the piezoelectric device of this invention would not impair the piezoelectric properties of the piezoelectric film.

Subsequently, a withstand voltage of the piezoelectric device of this example was measured. As a result, the withstand voltage of a conventional product which did not comprise the diffusion preventing layer was 50V, while the withstand voltage of the piezoelectric device of this example was 60V. It was confirmed that the withstand voltage enhanced by 20%.

EXAMPLE 2

The piezoelectric device was manufactured by the manufacturing method of this embodiment by changing the thickness of the lower electrode, the thickness of the piezoelectric film, the number of times of baking and so on. Table 3 shows the results of measurement of adhesive strength between the lower electrode and the substrate in the piezoelectric device. However, a lamination structure of the manufactured piezoelectric device was a layer structure composed of the upper electrode (Pt), the piezoelectric film (PZT), the diffusion preventing layer (Ir-Ti), the lower electrode (Pt), and the substrate. As a comparison, a piezoelectric device having a layer structure without the diffusion preventing layer (the structure composed of the upper electrode (Pt), the piezoelectric film (PZT), the lower electrode (Pt), the adhesive layer (Ti), and the substrate) was used.

TABLE 3

|  | Film Thickness of Lower Electrode | Thickness of Piezoelectric Film | Number of Times of Baking | Adhesive strength |
| --- | --- | --- | --- | --- |
| Example | 500 nm | 0.8 µm | 2 | 18.5 mN |
| Comparison | 500 nm | 0.8 µm | 2 | 17.8 mN |
| Example | 500 nm | 1.2 µm | 4 | 16.6 mN |
| Comparison | 500 nm | 1.2 µm | 4 | 14.2 mN |
| Example | 300 nm | 1.2 µm | 4 | 12.2 mN |
| Comparison | 300 nm | 1.2 µm | 4 | 9.8 mN |

Table 4 shows the results of measurement of a breakdown voltage and a piezoelectric constant $d_{31}$ when the thickness of the piezoelectric film of this example was changed.

TABLE 4

|  | Thickness of Piezoelectric Film | Breakdown Voltage | $d_{31}$ at 15V | $d_{31}$ at 25V |
| --- | --- | --- | --- | --- |
| Example | 0.8 µm | 59V | 198 pC/N | 178 pC/N |
| Comparison | 0.8 µm | 41V | 178 pC/N | 161 pC/N |
| Example | 1.2 µm | 91V | 244 pC/N | 197 pC/N |
| Comparison | 1.2 µm | 62V | 191 pC/N | 170 pC/N |

As can be seen from Table 4, the breakdown voltage and the piezoelectric constant $d_{31}$ of this example are larger than those of the comparison. This is because a low dielectric constant layer does not exist at the interface between the lower electrode and the piezoelectric film in the piezoelectric device of this example.

The value of the piezoelectric constant $d_{31}$ varies depending on the measured voltage because there is a tendency of the piezoelectric constant $d_{31}$ to decrease as the electric field becomes higher. Accordingly, it is effective to increase the thickness of the piezoelectric film in order to enhance the properties of the piezoelectric device. However, it is not desirable to make the thickness of the piezoelectric film too large, because a displacement efficiency lowers. A desirable thickness of the piezoelectric film for an ink jet printing head of high resolution is in the range of approximately 1 µm to 2 µm.

Since the diffusion preventing layer is provided in Embodiment 3, the appearance of a low dielectric constant layer can be prevented and the withstand voltage of the piezoelectric device enhances. Since oxygen does not escape from the piezoelectric film because of the diffusion preventing layer, it is possible to prevent the separation between the piezoelectric film and the lower electrode and it is possible to provide a piezoelectric device, an ink jet printing head, and a printer which have long product-life cycles and which are highly reliable. Such a piezoelectric device can be activated at high frequencies. If an ink jet printing head which comprises this piezoelectric device as a piezoelectric actuator is used, finer printing is possible.

Other Variations

This invention can be applied in many variations without limitation to the respective embodiments described above. For example, the piezoelectric device manufactured according to this invention is not limited to the above-described manufacturing methods, but can be applied to other manufacturing methods.

The layer structure of the piezoelectric device is not limited to those described above, and it is also possible to manufacture a piezoelectric device with a plurality of layer structures by complexing the steps.

The structure of the ink jet printing head is not limited to the above-described structure, and a different structure may be employed as long as it is of a piezo-jet ink jet type.

The piezoelectric film device of this invention is not limited to the use as the piezoelectric device for the ink jet printing head as indicated in the above-described embodiments, and it can be applied to the manufacture of: ferroelectric devices such as nonvolatile semiconductor storage, thin film capacitors, pyroelectricity detectors, sensors, surface elasticity wave optical waveguides, optical storage, space light modulators, and diode laser frequency doublers; dielectric devices; pyroelectricity devices; piezoelectric devices; and electro-optic devices.

Industrial Applicability

Since this invention provides the diffusion preventing layer, it is possible to prevent the state where impurities diffuse in the lower electrode at the time of baking of the piezoelectric film and, as a result, the composition of the lower electrode becomes nonuniform.

Since this invention can maintain the orientation state of the lower electrode, it is possible to cause the piezoelectric film, which is formed over the lower electrode, to become oriented well, and to provide the piezoelectric device which exhibits superior piezoelectric properties.

Since this invention can make the composition of the lower electrode uniform in the thickness direction, the manufacture and designing become easy, for example, when the lower electrode is used as the diaphragm.

According to this invention, it is possible to prevent the phenomenon of diffusion of the principal component of the adhesive layer through the lower electrode into the piezoelectric film at the time of baking of the piezoelectric film, and to prevent the separation between the lower electrode and the piezoelectric film. Consequently, it is possible to provide the piezoelectric device, the ink jet printing head and the printer which are resistant to repeated fatigue caused when the piezoelectric device is used as a piezoelectric actuator, and which are superior in durability and are highly reliable.

What is claimed is:

1. A piezoelectric device exhibiting an electromechanical transducing action, comprising:
   a lower electrode;
   an adhesive layer composed of a material which enhances adhesion between a base plane of the piezoelectric device and said lower electrode;
   a diffusion preventing layer formed between said adhesive layer and said lower electrode, said diffusion prevention layer composed of a material which prevents a phenomenon of diffusion of a component of said adhesive layer into said lower electrode;
   a piezoelectric film formed over said lower electrode, said piezoelectric film exhibiting the electromechanical transducing action; and
   an upper electrode formed over said piezoelectric film.

2. A piezoelectric device exhibiting an electromechanical transducing action, comprising:
   an adhesive layer;
   a lower electrode formed over the adhesive layer, wherein the adhesive layer is composed of a material which enhances adhesion between a base plane of the piezoelectric device and said lower electrode;
   a diffusion preventing layer formed over said lower electrode;
   a piezoelectric film formed over said diffusion preventing layer, said piezoelectric film exhibiting electromechanical transducing action;
   wherein said diffusion layer is composed of a material which prevents a phenomenon of diffusion of a component of the adhesive layer into the piezoelectric film and also prevents a phenomenon of diffusion of a component of the piezoelectric film into the lower electrode; and
   an upper electrode formed over the piezoelectric film.

3. A piezoelectric device according to claim 1 or 2, wherein the diffusion preventing layer is an alloy of titanium and one device selected from a group consisting of iridium, palladium, rhodium, ruthenium, and osmium.

4. A piezoelectric device according to claim 1 or 2, wherein the adhesive layer contains, as its principal component, one device selected from a group consisting of titanium and chromium.

5. A piezoelectric device according to claim 1 or 2, wherein the lower electrode is composed of platinum as its principal component.

6. An ink jet printing head comprising the piezoelectric device according to claim 1, as a piezoelectric actuator, over a diaphragm which serves as the base plane.

7. An ink jet printing head according to claim 6, wherein the diaphragm has a laminated structure of silicon dioxide and zirconium oxide.

8. A printer comprising the ink jet printing head according to claim 6 as printing means.

9. A method for manufacturing a piezoelectric device exhibiting an electromechanical transducing action, comprising the steps of:

forming an adhesive layer over a base plane of the piezoelectric device;

forming a diffusion preventing layer over the adhesive layer;

forming a lower electrode over the diffusion preventing layer by using a conductive material;

forming a piezoelectric film over the lower electrode by using a piezoelectric material; and forming an upper electrode over the piezoelectric film by using a conductive material, wherein the adhesive layer is formed with a material which enhances adhesion between the base plane and the lower electrode; and wherein said diffusion preventing layer is formed with a material which prevents a phenomenon of diffusion of a component of the adhesive layer into the lower electrode.

10. A method for manufacturing a piezoelectric device exhibiting an electromechanical transducing action, comprising the steps of:

forming an adhesive layer over a base plane of the piezoelectric device;

forming a lower electrode over the adhesive layer by using a conductive material;

forming a diffusion preventing layer over the lower electrode with a material which prevents a phenomenon of diffusion of a component of the adhesive layer into the piezoelectric film, and which also prevents a phenomenon of diffusion of a component of the piezoelectric film into the lower electrode;

forming a piezoelectric film over the diffusion preventing layer by using a piezoelectric material; and forming an upper electrode over the piezoelectric film by using a conductive material, wherein the adhesive layer is formed with a material which enhances adhesion between the base plane and the lower electrode.

11. A method for manufacturing a piezoelectric device according to claim 9 or 10, wherein the diffusion preventing layer forming step is the step of forming the diffusion preventing layer by using, as its principal component, one device selected from a group consisting of iridium, palladium, rhodium, ruthenium, and osmium as starting materials.

12. A method for manufacturing a piezoelectric device according to claim 9 or 10, wherein the adhesive layer forming step is the step of forming the adhesive layer by using, as its principal component, one device selected from a group consisting of titanium and chromium.

13. A method for manufacturing a piezoelectric device according to claim 9 or 10, wherein the lower electrode forming step is the step of forming the lower electrode by using platinum as its material.

14. A method for manufacturing a piezoelectric device according to claim 9 or 10, wherein the piezoelectric film forming step is the step including a thermal treatment step.

* * * * *